United States Patent
Tanaka et al.

(10) Patent No.: US 10,554,011 B2
(45) Date of Patent: Feb. 4, 2020

(54) LIGHT SOURCE DEVICE AND WAVELENGTH CONVERSION METHOD USING NON-LINEAR CRYSTAL AND A FIRST AND SECOND OPTICAL PATH LENGTH CONTROL MECHANISM

(71) Applicant: SONY CORPORATION, Tokyo (JP)

(72) Inventors: Kenji Tanaka, Tokyo (JP); Goro Fujita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 28 days.

(21) Appl. No.: 15/035,375

(22) PCT Filed: Nov. 17, 2014

(86) PCT No.: PCT/JP2014/080364
§ 371 (c)(1),
(2) Date: May 9, 2016

(87) PCT Pub. No.: WO2015/093210
PCT Pub. Date: Jun. 25, 2015

(65) Prior Publication Data
US 2016/0294154 A1    Oct. 6, 2016

(30) Foreign Application Priority Data

Dec. 20, 2013  (JP) ................. 2013-264000

(51) Int. Cl.
*H01S 5/00*    (2006.01)
*G02F 1/35*    (2006.01)
(Continued)

(52) U.S. Cl.
CPC ........... *H01S 5/0092* (2013.01); *G02F 1/353* (2013.01); *G02F 1/3551* (2013.01); *G02F 1/39* (2013.01);
(Continued)

(58) Field of Classification Search
CPC ......... H01S 5/0092; H01S 5/14; H01S 5/065; H01S 5/0427; H01S 3/109; G02F 1/3551;
(Continued)

(56) References Cited

U.S. PATENT DOCUMENTS 4,583,227 A * 4/1986 Kirkby ............... H01S 5/14
                                                       372/32
5,134,622 A * 7/1992 Deacon ............... G02F 1/39
                                                       307/424
(Continued)

FOREIGN PATENT DOCUMENTS

| JP | 06-265953 A | 9/1994 |
| JP | 08-194240 A | 7/1996 |
| JP | 2007-233039 A | 9/2007 |

OTHER PUBLICATIONS

Rintaro Koda et al, "100 W Peak-Power 1 Ghz Repetition Picoseconds Optical Pulse Generation Using Blue-Violet GaInN Diode Laser Mode-Locked Oscillator and Optical Amplifier", American Institute of Physics, Applied Physics Letters 97, 021101-1, 2010, pp. 3.

(Continued)

*Primary Examiner* — Que Tan Le
*Assistant Examiner* — Jennifer D Bennett
(74) *Attorney, Agent, or Firm* — Chip Law Group

(57) ABSTRACT

A light source device according to the present disclosure that is provided with a semiconductor laser unit configured to emit excitation light of a prescribed wavelength, a wavelength conversion unit configured to amplify the excitation light by causing the excitation light to resonate and generate output light of a different wavelength from the excitation light using a prescribed non-linear crystal, the wavelength conversion unit including a first optical path for amplifying the excitation light, and a second optical path for generating the output light, a first servo mechanism configured to (Continued)

control an optical path length of the first optical path, and a second servo mechanism configured to control an optical path length of the second optical path.

12 Claims, 8 Drawing Sheets

(51) Int. Cl.
*G02F 1/39* (2006.01)
*G02F 1/355* (2006.01)
*H01S 5/065* (2006.01)
*H01S 5/14* (2006.01)

(52) U.S. Cl.
CPC ............... *H01S 5/065* (2013.01); *H01S 5/14* (2013.01); *G02F 2001/3542* (2013.01)

(58) Field of Classification Search
CPC .......... G02F 1/39; G02F 1/3544; G02F 1/353; G02F 2001/3542; G02B 17/023
See application file for complete search history.

(56) References Cited

U.S. PATENT DOCUMENTS

| | | | | |
|---|---|---|---|---|
| 5,625,633 | A * | 4/1997 | Ichimura | G02F 1/37 372/32 |
| 6,181,461 | B1 * | 1/2001 | Wada | G02F 1/37 359/326 |
| 6,285,691 | B1 * | 9/2001 | Kaneda | H01S 3/10092 372/18 |
| 6,404,786 | B1 * | 6/2002 | Kondo | G02F 1/3501 372/101 |
| 8,000,372 | B1 * | 8/2011 | Austin | H01S 3/083 372/93 |
| 2002/0171912 | A1 * | 11/2002 | Masuda | G02F 1/3532 359/326 |
| 2003/0165164 | A1 * | 9/2003 | Delfyett | H01S 5/065 372/18 |
| 2008/0240176 | A1 * | 10/2008 | Masuda | G02F 1/0121 372/21 |

OTHER PUBLICATIONS

Rintaro Koda et al, "300W Peak Power Picosecond Optical Pulse Generation by Blue-Violet GaInN Mode-Locked Laser Diode and Semiconductor Optical Amplifier", The Japan Society of Applied Physics, DOI: 10.1143/APEX.5.022702, Applied Physics Express 5 022702-1, January 30, 2012, pp. 3.

R. W. P. Drever et al, "Laser Phase and Frequency Stabilization Using an Optical Resonator", Applied Physics B, Appl. Phys. B 31, Feb. 10, 1983, pp. 9.

Masayoshi Watanabe et al, "Sum-Frequency Generation Near 194NM With an External Cavity by Simultaneous Enhancement of Frequency-Stabilized Fundamental Lasers", Jpn, J, Appl. Phys. vol. 33 (1094), Part 1, No. 3B, Mar. 1994, pp. 1590-1002.

Rintaro Koda et al., "300W Peak Power Picosecond Optical Pulse Generation by Blue-Violet GaInN Mode-Locked Laser Diode and Semiconductor Optical Amplifier", Applied Physics Express 5, The Japan Society of Applied Physics, Jan. 30, 2012, p. 3.

R. W. P. Drever, "Laser Phase and Frequency Stabilization Using an Optical Resonator", Appl. Phys. B 31, Feb. 10, 1983, pp. 97-105.

Rintaro Koda et al., "100 W Peak-Power 1 Ghz Repetition Picoseconds Optical Pulse Generation Using Blue-Violet GaLnN Diode Laser Mode-Locked Oscillator and Optical Amplifier", 2010 American Institute of Physics, Jul. 12, 2010, p. 3.

Masayoshi Watanabe et al., "Sum-Frequency Generation Near 194 Nm With an External Cavity by Simultaneous Enhancement of Frequency-Stabilized Fundamental Laser", Jpn. J. Appl. Phys. vol. 33, Mar. 1994, pp. 1599-1602.

* cited by examiner

LIGHT SOURCE DEVICE AND WAVELENGTH CONVERSION METHOD USING NON-LINEAR CRYSTAL AND A FIRST AND SECOND OPTICAL PATH LENGTH CONTROL MECHANISM

CROSS REFERENCE TO RELATED APPLICATIONS

This application is a U.S. National Phase of International Patent Application No. PCT/JP2014/080364 filed on Nov. 17, 2014, which claims priority benefit of Japanese Patent Application No. JP 2013-264000 filed in the Japan Patent Office on Dec. 20, 2013. Each of the above-referenced applications is hereby incorporated herein by reference in its entirety.

TECHNICAL FIELD

The present disclosure relates to a light source device and a wavelength conversion method.

BACKGROUND ART

In forms of lasers, pulse lasers for enabling intermittent light emission separately from a continuously oscillating continuous wave (CW) laser can significantly increase peak power and are used in various fields such as optical processing and non-linear optics.

In recent years, a mode-locked laser obtained by operating a semiconductor laser in the form of an external resonator has served as a master laser and a high peak power of a few hundred watts (Ws) has been reported in a so-called master oscillation power amplifier (MOPA) for amplifying an optical output of the master laser in a semiconductor optical amplifier (for example, see the following Non-Patent Literatures 1 and 2).

CITATION LIST

Non-patent Literature

Non-Patent Literature 1: R. Koda et al., "100 W peak-power 1 GHz repetition picoseconds optical pulse generation using blue-violet GaIn diode laser mode-locked oscillator and optical amplifier," Applied Physics Letters, 97,021101 (2010).

Non-Patent Literature 2: R. Koda et al., "300 W Peak Power Picosecond Optical Pulse Generation by Blue-Violet GaInN Mode-Locked Laser Diode and Semiconductor Optical Amplifier," Applied Physics Express, 5,022702 (2012).

Non-Patent Literature 3: R. W. P. Dreyer et al., "Laser Phase and Frequency Stabilization Using an Optical Resonator," Applied Physics B, 31, 97-105 (1983)

SUMMARY OF INVENTION

Technical Problem

A wavelength of a semiconductor pulse laser disclosed in the above-described Non-Patent Literatures 1 and 2 is a fixed wavelength, for example, such as 405 nm, due to a semiconductor element. Thus, if it is possible to perform wavelength conversion on the basis of conventional non-linear optics, the size and cost of a light source can be reduced more than those of a solid-state laser.

However, it is not possible to obtain a sufficient non-linear phenomenon at a peak power of a few hundred Ws of a semiconductor pulse laser as disclosed in the above-described Non-Patent Literatures 1 and 2 and a laser output is also unstable.

Therefore, the present disclosure proposes a light source device and a wavelength conversion method capable of performing stable wavelength conversion using a semiconductor laser.

Solution to Problem

According to the present disclosure, there is provided a light source device including: a semiconductor laser unit configured to emit excitation light of a prescribed wavelength; a wavelength conversion unit configured to amplify the excitation light by causing the excitation light to resonate and generate output light of a different wavelength from the excitation light using a prescribed non-linear crystal, the wavelength conversion unit including a first optical path for amplifying the excitation light, and a second optical path for generating the output light; a first optical path length control mechanism configured to control an optical path length of the first optical path; and a second optical path length control mechanism configured to control an optical path length of the second optical path.

According to the present disclosure, there is provided a wavelength conversion method including: guiding excitation light of a prescribed wavelength emitted from a semiconductor laser unit to a wavelength conversion unit configured to amplify the excitation light by causing the excitation light to resonate and generate output light of a different wavelength from the excitation light using a prescribed non-linear crystal, the wavelength conversion unit including a first optical path for amplifying the excitation light, and a second optical path for generating the output light; optimizing an optical path length of the first optical path by controlling a first optical path length control mechanism configured to control the optical path length of the first optical path; and optimizing an optical path length of the second optical path by controlling a second optical path length control mechanism configured to control the optical path length of the second optical path.

According to the present disclosure, a first optical path for amplifying excitation light and a second optical path for generating output light are separately optimized by controlling a first optical path length control mechanism and a second optical path length control mechanism, so that a wavelength conversion unit performs wavelength conversion according to a non-linear optical effect while the excitation light from a semiconductor laser is amplified.

Advantageous Effects of Invention

According to the present disclosure as described above, stable wavelength conversion can be performed using a semiconductor laser.

Note that the effects described above are not necessarily limited, and along with or instead of the effects, any effect that is desired to be introduced in the present specification or other effects that can be expected from the present specification may be exhibited.

DESCRIPTION OF EMBODIMENT(S)

Hereinafter, (a) preferred embodiment(s) of the present disclosure will be described in detail with reference to the appended drawings. In this specification and the drawings, elements that have substantially the same function and structure are denoted with the same reference signs, and repeated explanation is omitted.

In addition, description will be provided in the following order.
1. First embodiment
2. Overall configuration of light source device
3. Configuration of control unit
4. Wavelength conversion method

1. First Embodiment

<Overall Configuration of Light Source Device>

Figure 1:
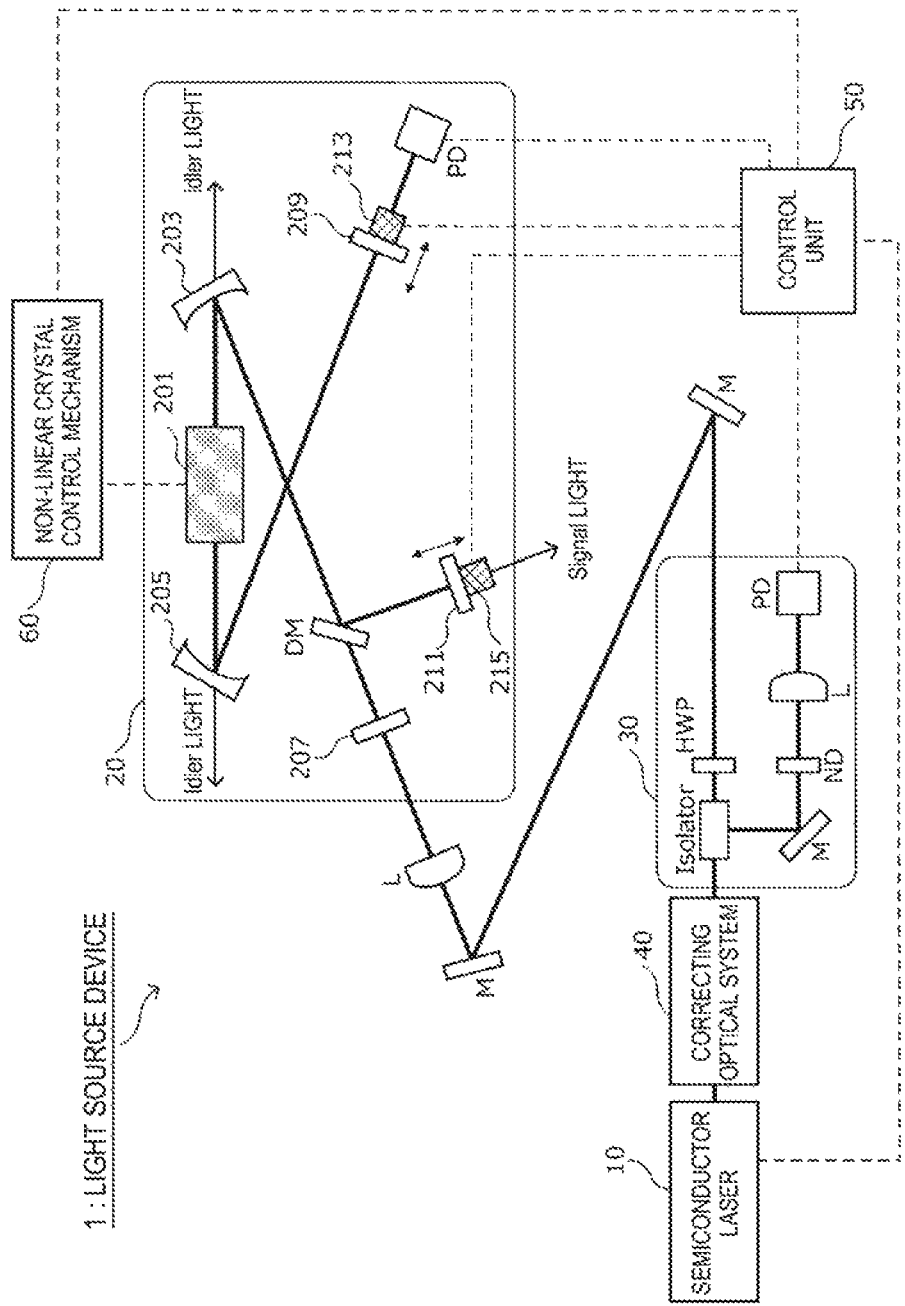
FIG. 1 is an explanatory diagram schematically illustrating an example of a configuration of a light source device according to a first embodiment of the present disclosure.

First, the overall configuration of the light source device according to the first embodiment of the present disclosure will be described in detail with reference to FIG. 1. FIG. 1 is an explanatory diagram schematically illustrating an example of a configuration of a light source device according to the present embodiment.

As illustrated in FIG. 1, a light source device 1 according to the present embodiment includes a semiconductor laser 10 which is an example of a semiconductor laser unit, a wavelength conversion resonator 20 which is an example of a wavelength conversion unit, a reflected light detection unit 30, a correcting optical system 40, a control unit 50, and a non-linear crystal control mechanism 60.
[Semiconductor Laser 10]

The semiconductor laser 10 is a device for emitting light of a prescribed wavelength which is used as excitation light under control by a control unit to be described below. This semiconductor laser 10 is not particularly limited and a well-known semiconductor laser can be used as the semiconductor laser, but it is preferable to use a semiconductor pulse laser. Also, a continuous wave (CW) laser using a semiconductor can also be used as long as sufficient peak power can be implemented.

Figure 2:
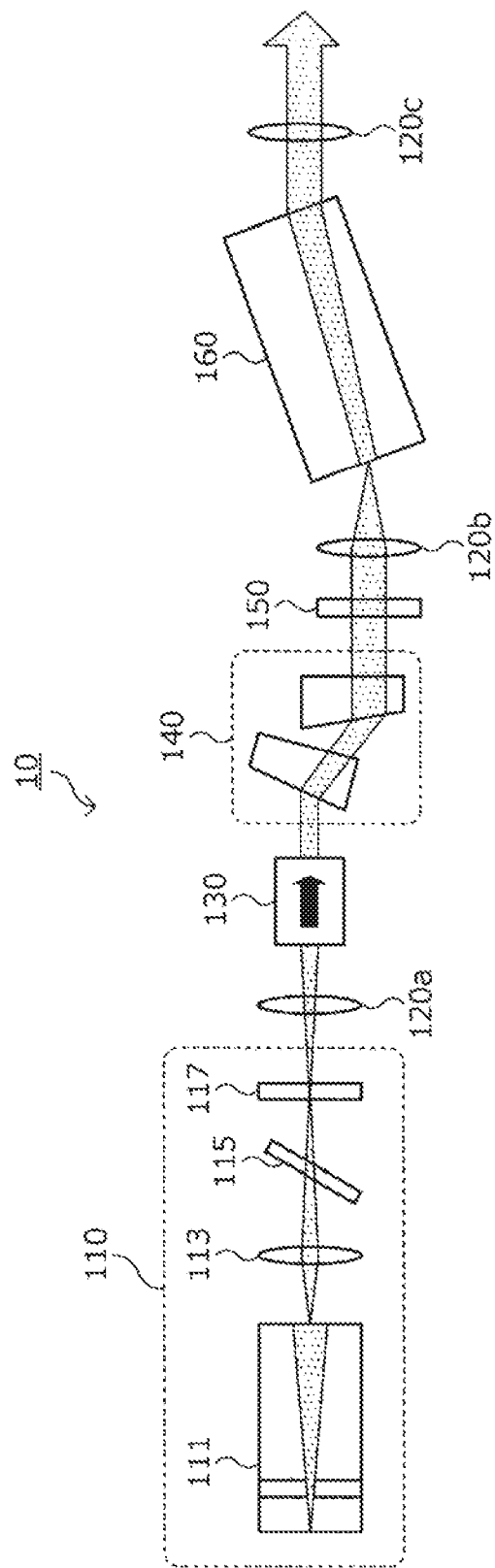
FIG. 2 is an explanatory diagram schematically illustrating an example of a semiconductor laser used in the light source device according to the first embodiment.

FIG. 2 is a schematic diagram illustrating a configuration of a master oscillation power amplifier (MOPA) system which is a semiconductor pulse laser preferably available as the semiconductor laser 10 according to this embodiment.

Hereinafter, a configuration example of the MOPA system will be described with reference to FIG. 2. Also, the MOPA system applied to the light source device 1 according to the present embodiment is not limited to the configuration illustrated in FIG. 2. Any well-known MOPA system may be applied to the light source device 1.

As illustrated in FIG. 2, this semiconductor laser 10 includes a mode-locked oscillator 110, lenses 120a, 120b, and 120c, an isolator 130, a prism pair 140, a λ/2 plate 150, and a semiconductor optical amplifier (SOA) 160.

Also, in FIG. 2, the configuration of a semiconductor pulse laser for emitting blue pulse light (pulse light in which a wavelength is between about 350 nm and about 500 nm) is illustrated as example of the semiconductor pulse laser according to the present embodiment. However, the semiconductor pulse laser according to the present embodiment is not limited to the semiconductor pulse laser for emitting the blue pulse light, and pulse light of another wavelength band may be emitted. Also, when the semiconductor pulse laser emits pulse light of another wavelength band, optical characteristics of each configuration member provided in the semiconductor pulse laser may be appropriately adjusted according to a wavelength band of the emitted pulse light. Also, unless particularly disclosed in the following description, the blue light is assumed to be light in which the wavelength is between about 350 nm and about 500 nm.

The mode-locked oscillator 110 emits pulse-like laser light by causing an output of the semiconductor laser for emitting light of a predetermined wavelength to resonate according to a resonator structure. The mode-locked oscillator 110 includes a laser diode 111, a collimator lens 113, a band pass filter (BPF) 115, and an output mirror 117.

In the present embodiment, the laser diode 111 is a bisectional-laser diode (BS-LD) having GaInN as a main raw material. Also, the laser diode 111 functions as a mode-locked laser diode (MLLD) and can emit the pulse light of the wavelength band between about 350 nm and about 500 nm.

The pulse light emitted from the laser diode 111 passes through the collimator lens 113, the BPF 115, and the output mirror 117, and is emitted from the mode-locked oscillator 110. Also, the pulse light emitted from the mode-locked oscillator 110 is adjusted to a wavelength of, for example, about 405 nm, by the BPF 115.

The pulse light emitted from the laser diode 111 passes through the lens 120a, the isolator 130, the prism pair 140, the λ/2 plate 150, and the lens 120b in this order provided in a subsequent stage and is incident on the SOA 160. A polarization direction of the pulse light is adjusted by the λ/2 plate 150. Also, coupling efficiency of the pulse light passing through the prism pair 140 and incident on the SOA 160 is improved. The pulse light amplified by the SOA 160 is externally emitted via the lens 120c.

The configuration example of the MOPA system which is the semiconductor pulse laser preferably available as the semiconductor laser 10 according to the present embodiment has been described above with reference to FIG. 2. In the semiconductor pulse laser having the above-described MOPA system, pulse light having an output of about a few hundred Ws and a pulse time width of about 3 ps can be generated.

Also, when a semiconductor pulse laser as described above is used as the semiconductor laser 10 according to the present embodiment, the above-described semiconductor pulse laser may be configured without the SOA 160.
[Wavelength Conversion Resonator 20]

The wavelength conversion resonator 20 which is an example of the wavelength conversion unit will be described with reference back to FIG. 1.

Under control of the control unit 50 to be described below, the wavelength conversion resonator 20 amplifies the excitation light emitted from the semiconductor laser 10 by causing the excitation light emitted from the semiconductor laser 10 to resonate and generates output light having a different wavelength from the excitation light using a prescribed non-linear crystal. This wavelength conversion resonator 20 is a so-called pump resonant type wavelength conversion resonator, and is constituted of a first optical path for amplifying the excitation light and a second optical path for generating the output light. Hereinafter, the configuration of the wavelength conversion resonator 20 will be described in detail.

This wavelength conversion resonator 20 includes a non-linear crystal 201, curved mirrors 203 and 205, an excitation light input coupler 207, an excitation light mirror 209, a signal light output coupler 211, a first servo mechanism 213 which is an example of a first optical path length control mechanism, and a second servo mechanism 215 which is an example of a second optical path length control mechanism. Also, a dichroic mirror DM for branching the first optical path and the second optical path described above and a photo-detector PD for detecting the intensity of signal light within the wavelength conversion resonator 20 are provided in the wavelength conversion resonator 20.

The non-linear crystal 201 is crystal for use in wavelength conversion of the excitation light and converts a wavelength of incident excitation light into another wavelength different from the wavelength of the excitation light according to birefringence provided in the crystal. This non-linear crystal 201 determines availability according to a wavelength of the excitation light. For example, when blue light as described above is used as the semiconductor laser 10, a well-known non-linear crystal for blue light such as BBO ($\beta$-$BaB_2O_4$), LBO ($LiB_3O_5$), BiBO ($BiB_3O_6$), LN ($LiNbO_3$), LT ($LiTaO_3$), or KTP ($KTiOPO_4$) can be used as the non-linear crystal 201. Also, when light other than the blue light is used as the semiconductor laser 10, it is only necessary to use a well-known non-linear crystal corresponding to such a wavelength.

The output light having a different wavelength from the excitation light can be obtained by causing the excitation light to pass through the non-linear crystal 201. Also, the wavelength of the output light generated by the non-linear crystal 201 can be switched by controlling a temperature or an installation angle of the non-linear crystal. The temperature and the installation angle of the non-linear crystal are controlled by the non-linear crystal control mechanism 60 to be described below.

The curved mirrors 203 and 205, the excitation light input coupler 207, the excitation light mirror 209, and the signal light output coupler 211 are not particularly limited, and it is only necessary to use well-known components therefor. The dichroic mirror DM is not particularly limited as long as there is low loss for both the excitation light and the output light, but a well-known dichroic mirror can be used.

The excitation light emitted from the semiconductor laser 10 is guided from the excitation light input coupler 207 to the inside of the wavelength conversion resonator 20 via a mirror M, a focusing lens L, or the like. Thereafter, the excitation light follows an optical path in the curved mirror 203, the non-linear crystal 201, the curved mirror 205, the excitation light mirror 209, the curved mirror 205, the non-linear crystal 201, the curved mirror 203, the excitation light input coupler 207, etc. This optical path corresponds to the above-described first optical path and functions as a resonator for amplifying the excitation light.

Also, the excitation light passes through the non-linear crystal 201, so that light such as signal light and idler light having a different wavelength from the excitation light is generated. In the light source device 1 according to the present embodiment, the signal light can be externally extracted and used as a light source and the idler light can be externally extracted and used as a light source. In the following description, an example in which the signal light is externally extracted will be described.

The signal light generated from the non-linear crystal 201 follows an optical path in the curved mirror 205, the excitation light mirror 209, the signal light output coupler 211, the curved mirror 203, the non-linear crystal 201, the curved mirror 203, etc. This optical path corresponds to the above-described second optical path and functions as a resonator configured to generate output light (signal light in the present description) and amplify an intensity of the output light.

As described above, the wavelength conversion resonator 20 according to the present embodiment internally has two optical paths as described above and serves as a biaxial optical system. Also, for the first resonator corresponding to the first optical path and the second resonator corresponding to the second optical path, one end portion of an optical element constituting each resonator is common in the excitation light mirror 209 and the other end portion is the excitation light input coupler 207 in the case of the first resonator, and is the signal light output coupler 211 in the case of the second resonator.

It is necessary for the wavelength conversion resonator 20 according to the present embodiment to cause the excitation light and an optical parametric oscillator (OPO) light (in further detail, at least one of two pieces of oscillation light) to resonate inside the wavelength conversion resonator 20 by introducing this pump resonant system. Here, it is necessary to adjust a resonator length (that is, optical path lengths of the above-described two types of optical paths) so that light is circulated within the resonator at a timing completely matching an oscillator cycle of the semiconductor laser (for example, a semiconductor pulse laser) which is an excitation light source for "resonance" (oscillation condition A).

However, because the wavelength conversion resonator 20 includes the above-described non-linear crystal 201, the optical distance may change according to a wavelength of light by chromatic dispersion of the crystal. As a result, it is effective to introduce the above-described biaxial optical system in which the optical path is separately provided so that each of the excitation light and the OPO light having different wavelengths satisfies the oscillation condition A.

In order to adjust the optical path lengths of the two resonators, the first servo mechanism 213 is provided for the excitation light mirror 209 positioned at one end portion of the first optical path, and the second servo mechanism 215 is provided for the signal light output coupler 211 positioned at another end portion of the second optical path. Thereby, the optical path length of the first optical path and the optical path length of the second optical path can each be independently controlled.

The control of the optical path length of the first optical path by the first servo mechanism 213 is performed according to an intensity of the obtained reflected light after the reflected light of the excitation light from the wavelength conversion resonator 20 is detected. The optical system for detecting the reflected light is a reflected light detection unit 30 illustrated in FIG. 1. This reflected light detection unit 30 will be described again below. Also, a control method of the first servo mechanism 213 will be described again below.

Also, the control of the optical path length of the second optical path by the second servo mechanism 215 is performed according to an intensity of the obtained signal light after the photo-detector PD detects an intensity of the signal light inside the wavelength conversion resonator 20. In order to perform this control, information related to the intensity of the signal light detected by the photo-detector PD is output to the control unit 50 to be described below. A control method of the second servo mechanism 215 will be described again below.

The first servo mechanism 213 and the second servo mechanism 215 described above are not particularly limited, and a well-known drive mechanism such as a voice coil motor or a piezoelectric element can be used.

[Reflected Light Detection Unit 30]

Next, the reflected light detection unit 30 provided in the light source device 1 according to the present embodiment will be described.

This reflected light detection unit 30 has a function of guiding the excitation light emitted from the semiconductor laser 10 to the wavelength conversion resonator 20 and branching the reflected light from the wavelength conversion resonator 20 to a detecting optical system for detecting the intensity of the reflected light.

As illustrated in FIG. 1, the excitation light from the semiconductor laser 10 passes through an isolator for separating the reflected light so that the reflected light does not return to the semiconductor laser 10 and the λ/2 plate (a half-wave plate (HWP)) and is guided to the wavelength conversion resonator 20. On the other hand, the reflected light from the wavelength conversion resonator 20 is guided to the photo-detector PD via a mirror M, a neutral density filter ND, and a lens L after passing through the λ/2 plate and the isolator. An optical system constituted of the mirror M, the neutral density filter ND, the lens L, and the photo-detector PD becomes the detecting optical system for detecting the intensity of the reflected light.

Information related to the intensity of the reflected light detected by the photo-detector PD is output to the control unit 50 to be described below and used to control the first servo mechanism 213.

[Correcting Optical System 40]

Next, the correcting optical system 40 will be described.

The correcting optical system 40 is an optical system provided as necessary to correct the excitation light emitted from the semiconductor laser 10. This correcting optical system 40 is provided to improve the coupling efficiency for the wavelength conversion resonator 20 by correcting a beam shape of the excitation light emitted from the semiconductor laser 10, an aberration, or the like. A detailed configuration of the correcting optical system 40 is not particularly limited, and a well-known optical system can be used as the correcting optical system 40. For example, an optical system in which a lens and an anamorphic lens are combined may be used as such the correcting optical system 40 and an optical system including a cylindrical lens may be used as such the correcting optical system 40. Also, when the excitation light emitted from the semiconductor laser 10 is high-quality light to an extent to which correction is unnecessary, it is needless to say that it is unnecessary to provide such a correcting optical system 40.

[Control Unit 50]

Next, the control unit 50 provided in the light source device 1 according to the present embodiment will be described. The control unit 50 is a processing unit configured to generally control the operation of the light source device 1 according to the present embodiment and control the operations of the semiconductor laser 10, the first servo mechanism 213, the second servo mechanism 215, and the non-linear crystal control mechanism 60. This control unit 50 may be a semiconductor chip, a circuit substrate, or the like constituted of a central processing unit (CPU), a read only memory (ROM), a random access memory (RAM), etc. mounted on the light source device 1 or may be various types of computers or servers or the like having a CPU, a ROM, a RAM, etc. capable of mutually communicating with the light source device 1. A detailed configuration of the control unit 50 will be described in detail below.

[Non-linear Crystal Control Mechanism 60]

Subsequently, the non-linear crystal control mechanism 60 provided in the light source device 1 according to this embodiment will be described.

The non-linear crystal control mechanism 60 retains a temperature of the non-linear crystal 201 provided within the wavelength conversion resonator 20 at a desired temperature. Also, under control of the control unit 50, the non-linear crystal control mechanism 60 changes the temperature of the non-linear crystal 201 or changes the installation angle of the non-linear crystal 201 to switch the wavelength of the output light from the wavelength conversion resonator 20.

A well-known heating or cooling mechanism can be used as such a non-linear crystal control mechanism 60 and well-known drive mechanisms such as various types of motors or piezoelectric elements can be used when the installation angle of the non-linear crystal 201 is changed.

The overall configuration of the light source device 1 according to the present embodiment will be described in detail with reference to FIGS. 1 and 2.

<Configuration of Control Unit>

Figure 3:
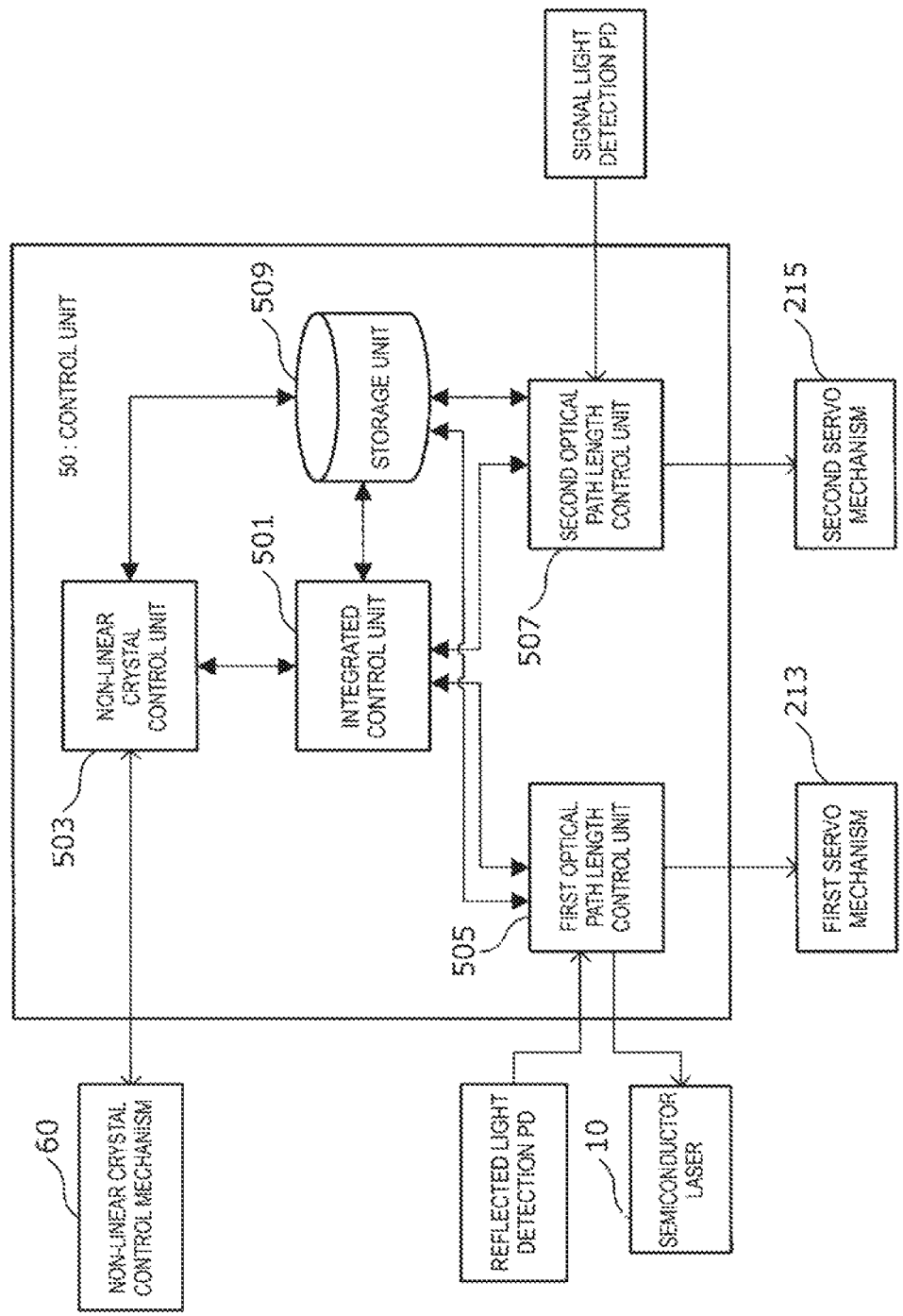
FIG. 3 is a block diagram illustrating an example of a configuration of a control unit provided in the light source device according to the first embodiment.
Figure 4:
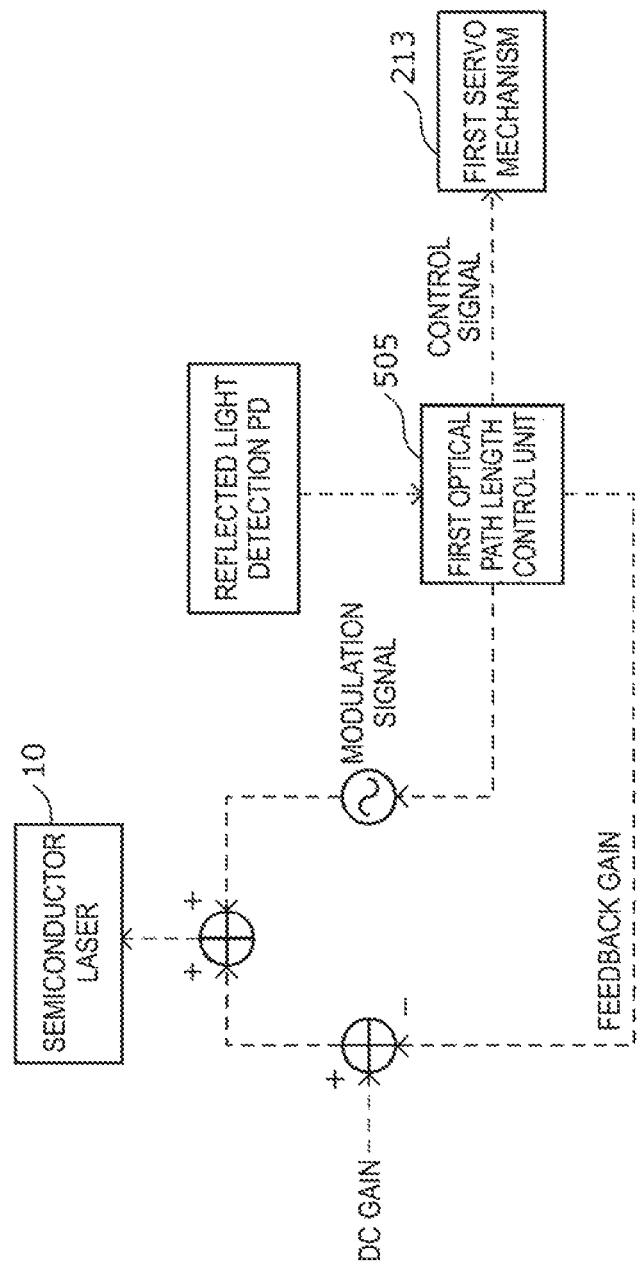
FIG. 4 is an explanatory diagram for describing an example of servo control performed by the control unit according to the first embodiment.
Figure 5:
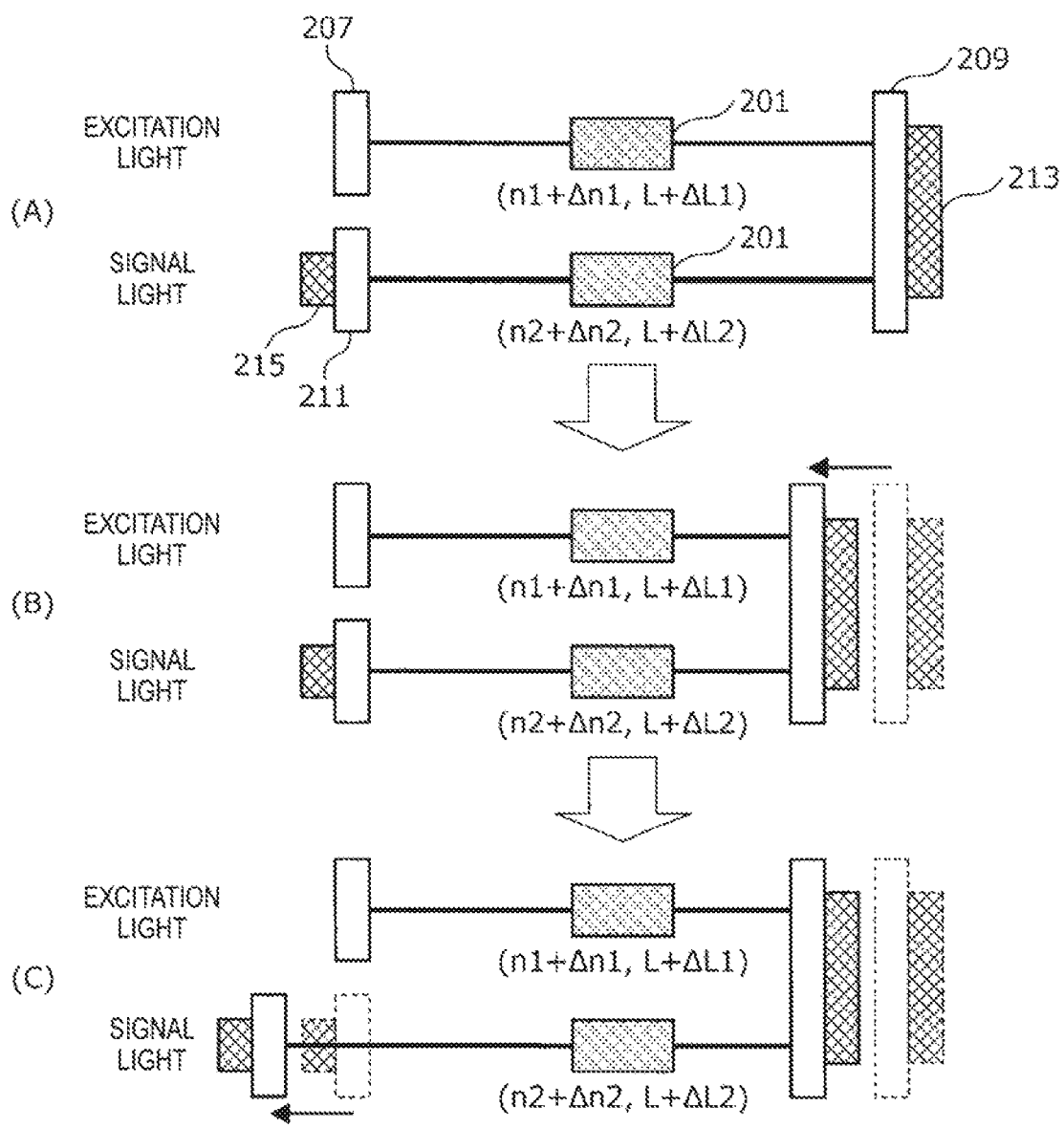
FIG. 5 is an explanatory diagram for describing a process of optimizing an optical path performed by the light source device according to the first embodiment.
Figure 6:
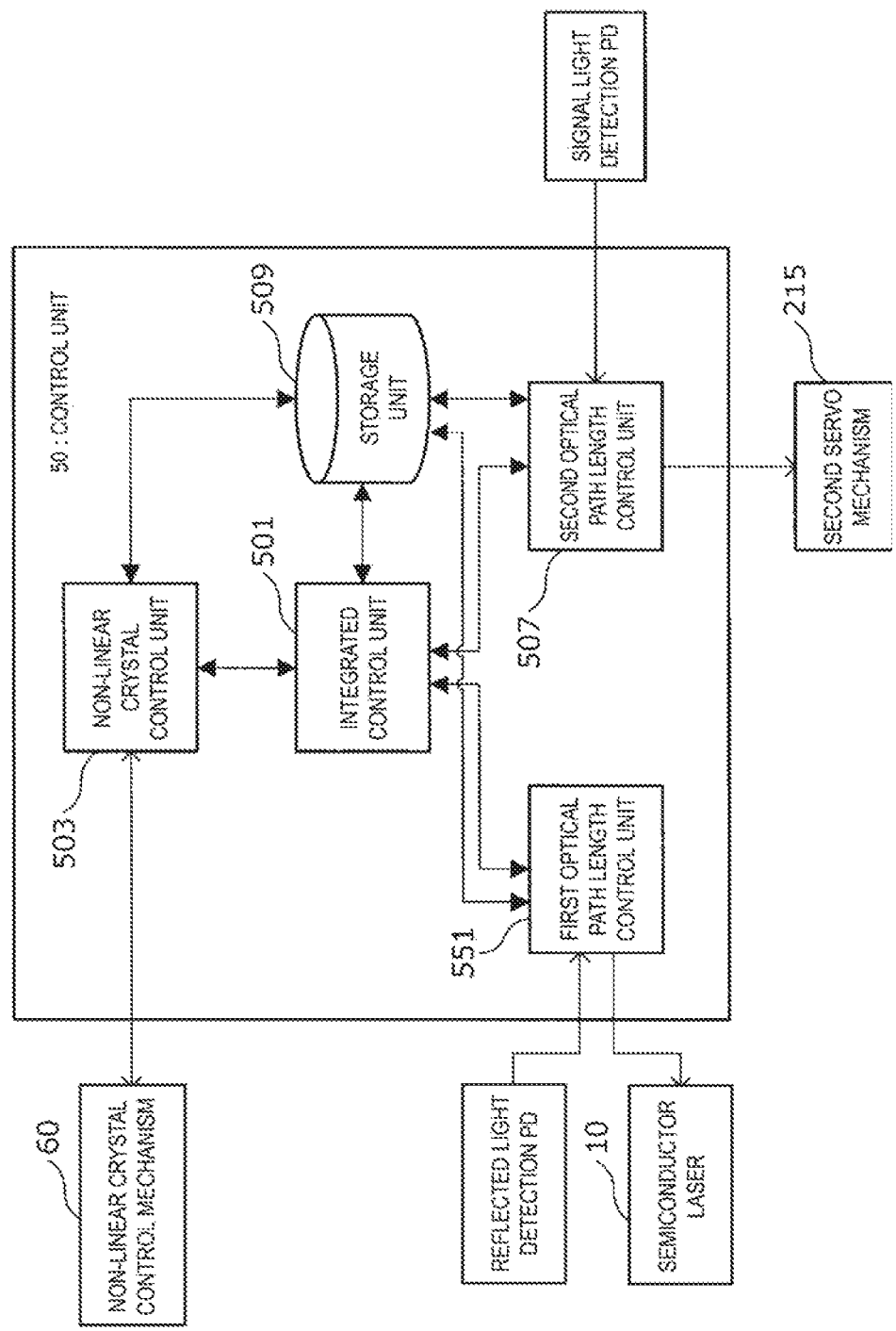
FIG. 6 is a block diagram illustrating an example of a configuration of the control unit provided in the light source device according to the first embodiment.
Figure 7:
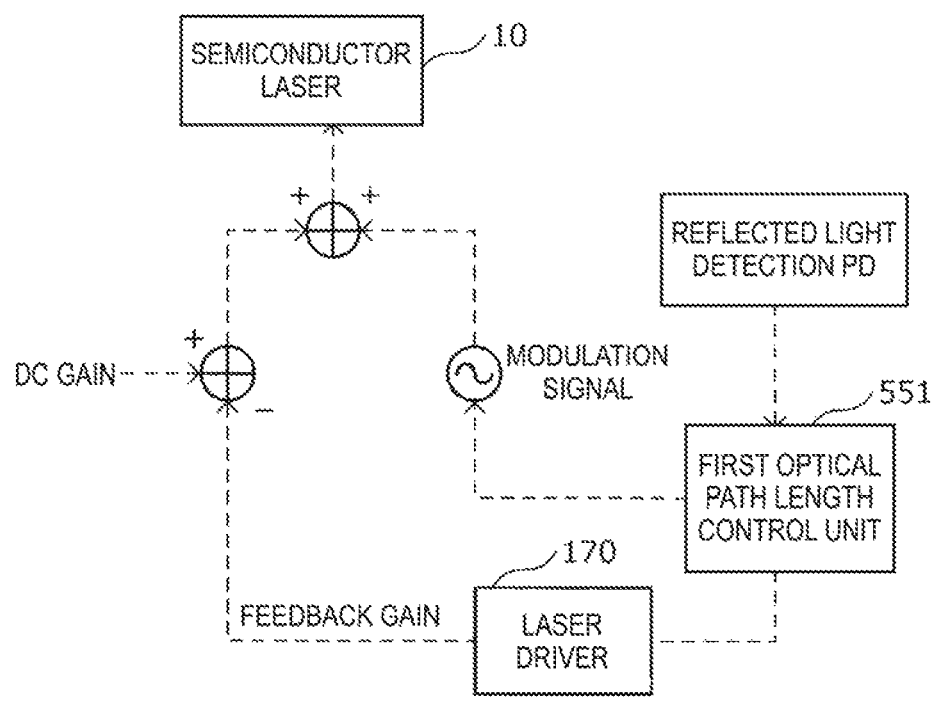
FIG. 7 is an explanatory diagram for describing an example of servo control performed by the control unit according to the first embodiment.

Next, the configuration of the control unit 50 provided in the light source device 1 according to the present embodiment will be described in detail with reference to FIGS. 3 to 7. FIGS. 3 and 6 are block diagrams illustrating examples of a configuration of a control unit provided in the light source device according to the present embodiment. FIGS. 4 and 7 are explanatory diagrams for describing examples of servo control performed by the control unit according to the present embodiment. FIG. 5 is an explanatory diagram for describing a process of optimizing an optical path performed by the light source device according to the present embodiment.

As illustrated in FIG. 3, the control unit 50 according to the present embodiment includes an integrated control unit 501, a non-linear crystal control unit 503, a first optical path length control unit 505, a second optical path length control unit 507, and a storage unit 509.

The integrated control unit 501 is implemented by, for example, a CPU, a ROM, a RAM, a communication device, etc. The integrated control unit 501 generally integrates various types of operations of the light source device 1 by transmitting and receiving various types of control signals between various types of devices or various types of mechanisms constituting the light source device 1 according to the present embodiment. Also, the non-linear crystal control unit 503, the first optical path length control unit 505, and the second optical path length control unit 507 can perform various types of control in conjunction with each other via the integrated control unit 501.

The non-linear crystal control unit 503 is implemented by, for example, a CPU, a ROM, a RAM, a communication device, etc. The non-linear crystal control unit 503 controls a state of the non-linear crystal 201 provided within the wavelength conversion resonator 20 by controlling the operation of the non-linear crystal control mechanism 60. That is, the non-linear crystal control unit 503 switches the temperature of the non-linear crystal 201 to a prescribed temperature, retains the temperature of the non-linear crystal 201, or changes the installation angle of the non-linear crystal 201 by outputting various types of control signals to the non-linear crystal control mechanism 60.

The retention control of the temperature of the non-linear crystal 201 by the non-linear crystal control unit 503 is appropriately performed when the light source device 1 according to the present embodiment is driven. Also, the switching control of the temperature or the switching control of the installation angle of the non-linear crystal 201 by the non-linear crystal control unit 503 is appropriately performed when a manipulation of switching the wavelength of the output light is performed by a user.

Also, when the above-described control of the non-linear crystal 201 is performed, the non-linear crystal control unit 503 may refer to various types of control parameters stored in the storage unit 509. These control parameters may be pre-stored in the storage unit 509 as various types of databases, etc. Also, the control parameters when control is performed may be retained in the storage unit 509 and used in the next control.

The first optical path length control unit 505 is implemented by, for example, a CPU, a ROM, a RAM, a communication device, etc. The first optical path length control unit 505 controls the driving of the semiconductor laser 100 on the basis of reflected light intensity-related information from the photo-detector PD provided in the reflected light detection unit 30 and controls the optical path length of the above-described first optical path by outputting the control signal to the first servo mechanism 213.

As a method of controlling a driving of the semiconductor laser 10 or the optical path length of the first optical path, a well-known control method, for example, such as a PDH method disclosed in the above-described Non-Patent Literature 3, can be applied.

Hereinafter, an example in which the driving of the semiconductor laser 10 or the optical path length of the first optical path is controlled using the PDH method will be described with reference to FIG. 4. FIG. 4 is an explanatory diagram for describing a method of driving control of the semiconductor laser 10 and servo control of the first servo mechanism using the PDH method.

In the PDH method, an excitation light source (reference light source) is modulated at a prescribed frequency (for example, 1 to about several tens of MHz) and feedback control is performed using a servo signal obtained by a correlation with a resonator. Here, in the conventional excitation light source, an optical element such as an optical modulation element is separately necessary as disclosed in the above-described Non-Patent Literature 3 to effectively perform frequency modulation and extra space and cost are necessary. However, because the semiconductor laser 10 is used as the excitation light source in the light source device 1 according to the present embodiment, an advantage of modulation characteristics of the semiconductor element can be taken and frequency modulation is enabled by directly assigning modulation information to the semiconductor laser (for example, the MLLD of the semiconductor pulse laser as illustrated in FIG. 2). As a result, the light source device 1 according to the present embodiment can use the PDH method while reducing the size and cost of the device.

As illustrated in FIG. 4, the first optical path length control unit 505 performs frequency modulation on the excitation light emitted from the semiconductor laser 10 according to a modulation signal of the above-described prescribed modulation frequency and performs feedback control of a current applied to a DC gain unit of the semiconductor laser 10 according to a detection result from the photo-detector PD provided in the reflected light detection unit 30. Also, the first optical path length control unit 505 generates a control signal for driving the first servo mechanism 213 according to the detection result from the photo-detector PD and outputs the generated control signal to the first servo mechanism 213. The first servo mechanism 213 changes the optical path length of the first optical path by moving the excitation light mirror 209 within the wavelength conversion resonator 20 by a prescribed amount along an optical axis on the basis of the control signal from the first optical path length control unit 505.

The second optical path length control unit 507 is implemented by, for example, a CPU, a ROM, a RAM, a communication device, etc. The second optical path length control unit 507 controls the optical path length of the above-described second optical path on the basis of intensity-related information from the photo-detector PD for signal light intensity detection provided in the wavelength conversion resonator 20. In further detail, the second optical path length control unit 507 generates a control signal for driving the second servo mechanism 215 according to a detection result from the photo-detector PD and outputs the generated control signal to the second servo mechanism 215. The second servo mechanism 215 changes the optical path length of the second optical path by moving the signal light output coupler 211 within the wavelength conversion resonator 20 by a prescribed amount along an optical axis on the basis of the control signal from the second optical path length control unit 507.

Also, a servo control method by the second optical path length control unit 507 is not particularly limited, and a well-known method such as a "hill-climbing method" by monitoring an output can be appropriately used as the servo control method.

Also, when servo control as described above is performed, the first optical path length control unit 505 and the second optical path length control unit 507 may refer to various types of control parameters stored in the storage unit 509. These control parameters may be pre-stored in the storage unit 509 as various types of databases, etc. Also, when the control is performed, the control parameters may be retained in the storage unit 509 and used in the next control.

As described above, it is also necessary for the light source device 1 according to the present embodiment to consider a servo control procedure to maximize wavelength conversion characteristics on the basis of a pump resonant scheme and a biaxial optical system. Hereinafter, the servo control procedure in the light source device 1 according to the present embodiment will be described with reference to FIG. 5.

As described above, the wavelength setting of the output light in the wavelength conversion resonator 20 is performed according to a crystal temperature or an installation angle of the non-linear crystal 201. Accordingly, in a startup time or a wavelength switching time of the light source device 1, the temperature or angle is set according to a designated wavelength by the non-linear crystal control mechanism 60 under control of the non-linear crystal control unit 503.

The temperature of the non-linear crystal 201 is changed by ΔT from an initial state (a temperature T) by the non-linear crystal control unit 503. As a result, as illustrated in FIG. 5(A), a refractive index and the optical path length of the non-linear crystal 201 for the excitation light are assumed to be n1+Δn1 and L1+ΔL1, respectively, and the refractive index and the optical path length of the non-linear crystal 201 for the signal light are assumed to be n2+Δn2 and L2+ΔL2, respectively.

Here, the integrated control unit 501 first instructs the first optical path length control unit 505 to optimize the optical path length of the first optical path, and the first optical path length control unit 505 optimizes the first optical path according to a method as described above. This control is performed by changing the position of the excitation light mirror 209 via the first servo mechanism 213 as illustrated in FIG. 5(B).

When the optimization of the first optical path by the first optical path length control unit 505 is completed and the state of the excitation light is optimized, the integrated control unit 501 subsequently instructs the second optical path length control unit 507 to optimize the optical path length of the second optical path. The second optical path length control unit 507 optimizes the second optical path length according to a method as describe above. This control is performed by changing the position of the signal light output coupler 211 via the second servo mechanism 215 in a state in which the position of the excitation light mirror 209 is fixed as illustrated in FIG. 5(C).

The wavelength conversion characteristics can be efficiently maximized by performing servo control in the above-described procedure.

The storage unit 509 provided in the control unit 50 will be described with reference back to FIG. 3.

The storage unit 509 is implemented by, for example, a RAM, a storage device, or the like. In the storage unit 509, various types of databases to be used when the integrated control unit 501, the non-linear crystal control unit 503, the first optical path length control unit 505, and the second optical path length control unit 507 perform various types of control, various types of programs including an application to be used in various types of computation processes to be executed by the integrated control unit 501, the non-linear crystal control unit 503, the first optical path length control unit 505, and the second optical path length control unit 507, various parameters and progress in process, etc. or various types of databases, etc. to be saved when any process is performed may be appropriately recorded.

Processing units such as the integrated control unit 501, the non-linear crystal control unit 503, the first optical path length control unit 505, and the second optical path length control unit 507 can freely access this storage unit 509 and data can be written to or read from the storage unit 509.

An example of a function of the control unit 50 according to the present embodiment has been shown above. Each component described above may be configured using a general-purpose member or circuit, or constituted of hardware specific to a function of each component. Also, all functions of the components may be performed by a CPU, etc. Accordingly, it is possible to appropriately change a configuration to be used according to a technical level when the present embodiment is performed.

[Modified Example of Control Unit]

Although the optical path length of the first optical path is controlled using the first servo mechanism 213 in control by the control unit 50 described above, it is also possible to control the optical path length of the first optical path using a method as will be described below. Hereinafter, a first modified example of the control unit 50 according to this embodiment will be briefly described with reference to FIGS. 6 and 7.

As illustrated in FIG. 6, as illustrated in FIG. 6, the control unit 50 according to the present modified example includes an integrated control unit 501, a non-linear crystal control unit 503, a first optical path length control unit 551, a second optical path length control unit 507, and a storage unit 509. Because the integrated control unit 501, the non-linear crystal control unit 503, the second optical path length control unit 507, and the storage unit 509 have similar functions to the processing units described in FIG. 3, a detailed description thereof will be omitted hereinafter.

The first optical path length control unit 551 according to the present modified example is implemented by, for example, a CPU, a ROM, a RAM, a communication device, etc. The first optical path length control unit 551 controls the optical path length of the above-described first optical path by controlling the driving of the semiconductor laser 10 on the basis of reflected light intensity-related information from the photo-detector PD provided in the reflected light detection unit 30.

As illustrated in FIG. 7, the first optical path length control unit 551 performs frequency modulation on the excitation light emitted from the semiconductor laser 10 according to a modulation signal of a prescribed modulation frequency. Also, the first optical path length control unit 551 generates a control signal for changing the refractive index within a semiconductor element of the semiconductor laser 10 according to a detection result from the photo-detector PD and outputs the generated control signal to a laser driver 170 of the semiconductor laser 10. The laser driver 170 generates a feedback gain on the basis of the input control signal from the input first optical path length control unit 551 and performs feedback control on a current applied to a DC gain unit of the semiconductor laser 10.

This is because the control signal is directly output to the semiconductor laser 10 so that a refractive index change within the semiconductor element occurs and an oscillation frequency (that is, the optical path length) of the semiconductor laser 10 changes.

It is possible to directly control the optical path length of the first optical path without using the first servo mechanism 213 by performing this control. However, a stable oscillation region in which the used semiconductor laser 10 can stably emit the excitation light is narrowed. Because control as described above is for directly controlling the output of the semiconductor laser 10, the state of the semiconductor laser 10 is also deviated from the stable oscillation region as a result of control when the semiconductor laser 10 of a narrow stable oscillation region is used. Accordingly, when the semiconductor laser 10 of the narrow stable oscillation region is used, it is possible to more stably control the driving of the light source device 1 when the control by the first servo mechanism 213 illustrated in FIG. 4 is performed.

The first modified example of the control unit 50 according to the present embodiment has been briefly described with reference to FIGS. 6 and 7.

<Wavelength Conversion Method>

Figure 8:
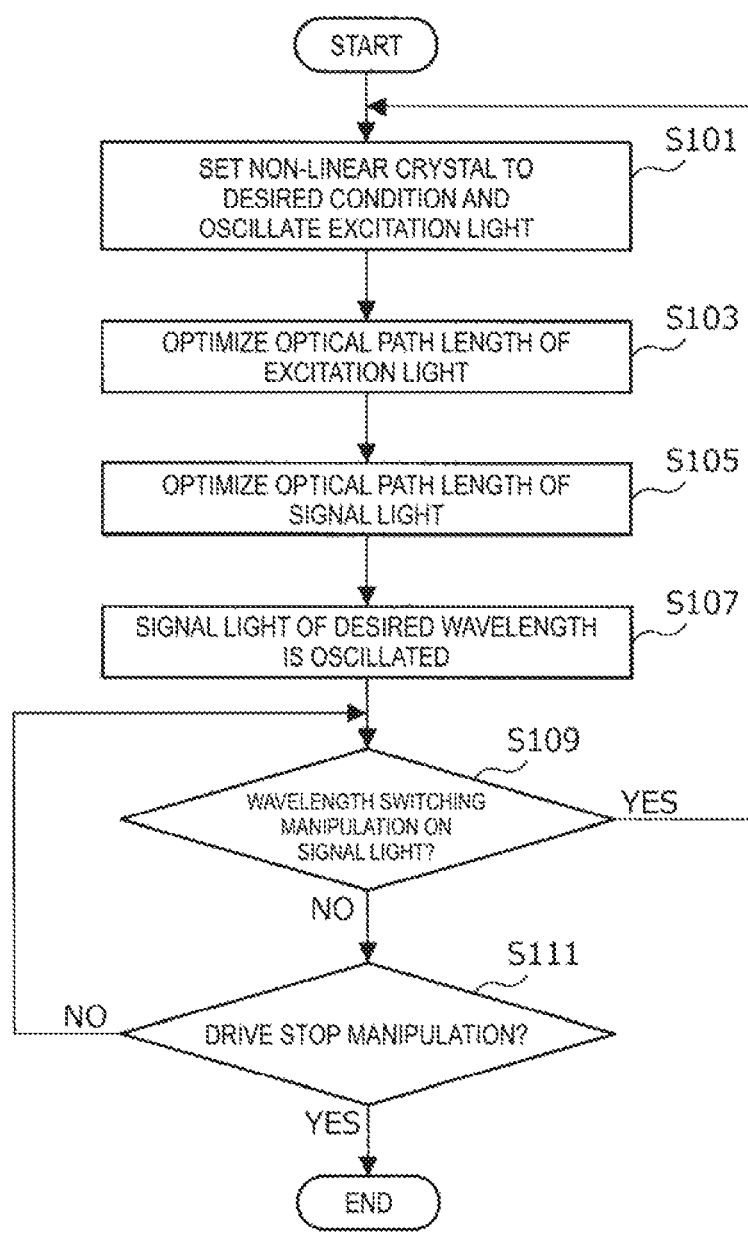
FIG. 8 is a flowchart illustrating an example of a flow of a wavelength conversion method according to the first embodiment.

Next, a flow of a wavelength conversion method to be performed by the light source device 1 according to the present embodiment will be briefly described with reference to FIG. 8. FIG. 8 is a flowchart illustrating an example of a flow of a wavelength conversion method according to the present embodiment.

In the light source device 1 according to the present embodiment, an excitation light of a prescribed wavelength is first oscillated from the semiconductor laser 10 after the non-linear crystal control mechanism 60 sets the non-linear crystal 201 to a desired condition under control of the non-linear crystal control unit 503 (step S101).

Thereafter, the first optical path length control unit 505 optimizes the optical path length of the first optical path (that is, the optical path length of the excitation light) without moving the signal light output coupler 211 in a method as described above (step S103).

Subsequently, the second optical path length control unit 507 optimizes the optical path length of the second optical path (that is, the optical path length of the signal light) by controlling the signal light output coupler 211 via the second servo mechanism 215 in a method as described above (step S105).

As described above, the signal light of the desired wavelength is stably oscillated by optimizing the optical path length of the signal light after the optical path length of the excitation light is optimized (step S107).

Here, the integrated control unit 501 determines whether a wavelength switching manipulation on the signal light is performed by a user (step S109). When the wavelength switching manipulation on the signal light is performed by the user, the control unit 50 performs switching control of the wavelength by returning to step S101.

On the other hand, when the user does not perform the wavelength switching manipulation on the signal light, the integrated control unit 501 determines whether a drive stop manipulation of the light source device 1 is performed by the user (step S111). When the drive stop manipulation of the light source device 1 is performed by the user, the driving of the device stops. On the other hand, when the user does not perform the drive stop manipulation of the light source device 1, the integrated control unit 501 returns to step S109 to await a wavelength switching process of the signal light.

The process is executed in a flow as described above so that the light source device 1 according to the present embodiment can convert the wavelength of the output light.

CONCLUSION

As described above, according to the light source device 1 according to the embodiment of the present disclosure and the wavelength conversion method, the stable wavelength conversion in which the output of the output light after the wavelength conversion is optimized can be implemented even when the semiconductor laser in which a peak power is insufficient is used as the excitation light source.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

In addition, the effects described in the present specification are merely illustrative and demonstrative, and not limitative. In other words, the technology according to the present disclosure can exhibit other effects that are evident to those skilled in the art along with or instead of the effects based on the present specification.

Additionally, the present technology may also be configured as below.

(1) A light source device including:
a semiconductor laser unit configured to emit excitation light of a prescribed wavelength;
a wavelength conversion unit configured to amplify the excitation light by causing the excitation light to resonate and generate output light of a different wavelength from the excitation light using a prescribed non-linear crystal, the wavelength conversion unit including a first optical path for amplifying the excitation light, and a second optical path for generating the output light;
a first optical path length control mechanism configured to control an optical path length of the first optical path; and
a second optical path length control mechanism configured to control an optical path length of the second optical path.

(2) The light source device according to (1), further including:
a reflected light detection unit configured to detect reflected light of the excitation light from the wavelength conversion unit; and
a control unit configured to independently control each of the first optical path length control mechanism and the second optical path length control mechanism,
wherein the excitation light is modulated at a prescribed frequency in the semiconductor laser unit, and
wherein the control unit controls a modulation frequency of the excitation light according to the reflected light detected by the reflected light detection unit and generates a first control signal for controlling the optical path length of the first optical path.

(3) The light source device according to (1) or (2),
wherein the first optical path length control mechanism is a first servo mechanism mounted on an optical element constituting the first optical path, and
wherein the second optical path length control mechanism is a second servo mechanism mounted on an optical element constituting the second optical path.

(4) The light source device according to (3), wherein the control unit generates a second control signal for changing the optical path length of the second optical path on the basis of an intensity of the output light inside the wavelength conversion unit and outputs the second control signal to the second servo mechanism.

(5) The light source device according to any one of (1) to (4), wherein the control unit optimizes the optical path length of the second optical path after optimizing the optical path length of the first optical path.

(6) The light source device according to any one of (3) to (5), wherein the control unit outputs the first control signal to the first servo mechanism and controls the optical path length of the first optical path.

(7) The light source device according to any one of (2), (4), and (5),
wherein the second optical path length control mechanism is a second servo mechanism mounted on an optical element constituting the second optical path, and
wherein the control unit outputs the first control signal to a laser control unit configured to control an operation of the semiconductor laser unit and controls the optical path length of the first optical path by controlling a drive current of the excitation light.

(8) The light source device according to any one of (2) to (7), further including:
a storage unit configured to store a control parameter set to control the optical path length of the first optical path and the optical path length of the second optical path,
wherein the control unit generates a control signal using the control parameter stored in the storage unit.

(9) The light source device according to any one of (1) to (8), wherein the semiconductor laser unit includes a semiconductor pulse laser using a mode-locked laser obtained by operating a semiconductor laser in the form of an external resonator.

(10) The light source device according to (9), wherein the semiconductor laser unit further includes a semiconductor optical amplifier configured to amplify an output of the mode-locked laser.

(11) The light source device according to any one of (2) to (10), further including:
a non-linear crystal control mechanism configured to control a temperature or an angle of the non-linear crystal,
wherein the control unit sets a wavelength of the output light by controlling the temperature or the angle of the non-linear crystal.

(12) A wavelength conversion method including:
guiding excitation light of a prescribed wavelength emitted from a semiconductor laser unit to a wavelength conversion unit configured to amplify the excitation light by causing the excitation light to resonate and generate output light of a different wavelength from the excitation light using a prescribed non-linear crystal, the wavelength conversion unit including a first optical path for amplifying the excitation light, and a second optical path for generating the output light;
optimizing an optical path length of the first optical path by controlling a first optical path length control mechanism configured to control the optical path length of the first optical path; and
optimizing an optical path length of the second optical path by controlling a second optical path length control mechanism configured to control the optical path length of the second optical path.

REFERENCE SIGNS LIST 1 light source device
10 semiconductor laser
20 wavelength conversion resonator
30 reflected light detection unit
40 correcting optical system
50 control unit
60 non-linear crystal control mechanism

The invention claimed is:
1. A light source device, comprising:
a semiconductor laser unit configured to emit excitation light of a first wavelength;
a wavelength conversion unit configured to:
amplify the excitation light by resonation of the excitation light, and
generate output light of a second wavelength from the amplified excitation light based on a non-linear crystal,
wherein the wavelength conversion unit includes:
a dichroic mirror configured to branch the emitted excitation light into a first optical path and a second optical path,
the first optical path to amplify the excitation light,
the second optical path to generate the output light, and
the resonance of the excitation light, resonated by the wavelength conversion unit, coincides with an oscillation cycle of the excitation light emitted by the semiconductor laser unit;
a first optical path length control mechanism configured to control a first optical path length of the first optical path; and
a second optical path length control mechanism configured to control a second optical path length of the second optical path.

2. The light source device according to claim 1, further comprising:
a reflected light detection unit configured to detect reflected light of the excitation light from the wavelength conversion unit; and
a control unit configured to:
independently control each of the first optical path length control mechanism and the second optical path length control mechanism, wherein the excitation light is modulated at a modulation frequency in the semiconductor laser unit,
control the modulation frequency of the excitation light based on the reflected light detected by the reflected light detection unit, and
generate a first control signal to control the first optical path length of the first optical path.

3. The light source device according to claim 2,
wherein the first optical path length control mechanism is a first servo mechanism mounted on a first optical element constituting the first optical path, and
wherein the second optical path length control mechanism is a second servo mechanism mounted on a second optical element constituting the second optical path.

4. The light source device according to claim 3, wherein the control unit is further configured to:
generate a second control signal to change the second optical path length of the second optical path based on an intensity of the output light inside the wavelength conversion unit, and
output the second control signal to the second servo mechanism.

5. The light source device according to claim 2, wherein the control unit is further configured to optimize the second optical path length of the second optical path after optimization of the first optical path length of the first optical path.

6. The light source device according to claim 3, wherein the control unit is further configured to:
output the first control signal to the first servo mechanism, and
control the first optical path length of the first optical path based on the output of the first control signal.

7. The light source device according to claim 2,
wherein the second optical path length control mechanism is a second servo mechanism mounted on an optical element constituting the second optical path, and
wherein the control unit is further configured to:
output the first control signal to a laser control unit configured to control an operation of the semiconductor laser unit, and
control the first optical path length of the first optical path based on a drive current of the excitation light.

8. The light source device according to claim 2, further comprising:
a storage unit configured to store a control parameter, wherein the control parameter controls the first optical path length of the first optical path and the second optical path length of the second optical path,
wherein the control unit is further configured to generate a second control signal based on the control parameter stored in the storage unit.

9. The light source device according to claim 1,
wherein the semiconductor laser unit includes a semiconductor pulse laser,
wherein the semiconductor pulse laser comprises a mode-locked laser, and
wherein the mode-locked laser is obtained by operation of a semiconductor laser as an external resonator.

10. The light source device according to claim 9, wherein the semiconductor laser unit further includes a semiconductor optical amplifier configured to amplify an output of the mode-locked laser.

11. The light source device according to claim 2, further comprising:
a non-linear crystal control mechanism configured to control one of a temperature or an angle of the non-linear crystal,
wherein the control unit is further configured to set a wavelength of the output light based on one of the temperature or the angle of the non-linear crystal.

12. A wavelength conversion method, comprising:
guiding excitation light of a first wavelength emitted from a semiconductor laser unit to a wavelength conversion unit,
wherein the wavelength conversion unit is configured to:
amplify the excitation light by causing the excitation light to resonate, and
generate output light of a second wavelength from the excitation light based on a non-linear crystal, and
wherein the wavelength conversion unit includes:
a dichroic mirror configured to branch an emitted excitation light into a first optical path and a second optical path,
the first optical path for amplifying the excitation light,
the second optical path for generating the output light, and
the resonance of the excitation light, resonated by the wavelength conversion unit, coincides with an oscillation cycle of the excitation light emitted by the semiconductor laser unit;
optimizing a first optical path length of the first optical path by controlling a first optical path length control mechanism configured to control the first optical path length of the first optical path; and
optimizing a second optical path length of the second optical path by controlling a second optical path length control mechanism configured to control the second optical path length of the second optical path.

* * * * *